United States Patent
Liu et al.

(10) Patent No.: US 12,470,190 B2
(45) Date of Patent: Nov. 11, 2025

(54) BLACKENED WAFERS AND METHOD FOR MANUFACTURING THE SAME, AND WAVE FILTER DEVICE HAVING THE SAME

(71) Applicant: FUJIAN JING'AN OPTOELECTRONICS CO., LTD., Quanzhou (CN)

(72) Inventors: Yilin Liu, Quanzhou (CN); Zhonghe Lin, Quanzhou (CN); Yenfu Lin, Quanzhou (CN); Shihwei Huang, Quanzhou (CN); Minghui Fang, Quanzhou (CN); Shengyu Yang, Quanzhou (CN)

(73) Assignee: FUJIAN JING'AN OPTOELECTRONICS CO., LTD., Quanzhou (CN)

( * ) Notice: Subject to any disclaimer, the term of this patent is extended or adjusted under 35 U.S.C. 154(b) by 672 days.

(21) Appl. No.: 17/874,905

(22) Filed: Jul. 27, 2022

(65) Prior Publication Data
US 2022/0368303 A1 Nov. 17, 2022

Related U.S. Application Data

(63) Continuation-in-part of application No. PCT/CN2020/118397, filed on Sep. 28, 2020.

(51) Int. Cl.
*H03H 3/08* (2006.01)
*H03H 9/145* (2006.01)
*H03H 9/25* (2006.01)
*H03H 9/64* (2006.01)

(52) U.S. Cl.
CPC .............. *H03H 3/08* (2013.01); *H03H 9/145* (2013.01); *H03H 9/25* (2013.01); *H03H 9/64* (2013.01); *Y10T 29/42* (2015.01)

(58) Field of Classification Search
CPC ............ H03H 3/08; H03H 9/64; H03H 9/145; H03H 9/25; Y10T 29/42
USPC ........................................ 29/25.35, 831, 846
See application file for complete search history.

(56) References Cited

U.S. PATENT DOCUMENTS 7,230,188 B1 * 6/2007 En .......................... C23C 18/405
174/257
2022/0344897 A1 * 10/2022 Kaji ..................... H01S 5/02355

FOREIGN PATENT DOCUMENTS

| CN | 110129891 A | 8/2019 |
|----|-------------|--------|
| CN | 110670134 A | 1/2020 |
| CN | 110760934 A | 2/2020 |

OTHER PUBLICATIONS

Search Report issued to PCT application No. PCT/CN2020/118397 on Jun. 28, 2021.

* cited by examiner

*Primary Examiner* — Thiem D Phan
(74) *Attorney, Agent, or Firm* — MUNCY, GEISSLER, OLDS & LOWE, P.C.

(57) ABSTRACT

A method for blackening at least one wafer includes: (a) performing a reduction treatment on the at least one wafer; and (b) illuminating the at least one wafer with an ultraviolet light. The at least one wafer after the illumination of the UV light has a blackening uniformity value (DE value) smaller than 0.6, and a chromatic value (L value) smaller than 54. In addition, a blackened wafer made from the method is also provided.

16 Claims, 7 Drawing Sheets

FIG.9

BLACKENED WAFERS AND METHOD FOR MANUFACTURING THE SAME, AND WAVE FILTER DEVICE HAVING THE SAME

CROSS-REFERENCE TO RELATED APPLICATION

This application is a continuation-in-part (CIP) application of PCT International Application No. PCT/CN2020/118397, filed on Sep. 28, 2020. The entire content of the international patent application is incorporated herein by reference.

FIELD

The disclosure relates to blackened wafers and a method for manufacturing the blackened wafers, and a wave filter device having the same.

BACKGROUND

Piezoelectric wafers are usually used in fabrication of surface acoustic wave (SAW) filters. Since the piezoelectric wafers have high transmittance, high pyroelectric coefficient and high resistivity, a large amount of static charges are easily accumulated on the surface of piezoelectric wafers of the SAW filters. Spontaneous electrostatic discharge of the static charges between interdigital electrodes formed on the piezoelectric wafers or between the piezoelectric wafers leads to cracking of the piezoelectric wafers or burning of the interdigital electrodes. Therefore, in order to solve these problems, a blackening process (reduction treatment) is performed on the piezoelectric wafers to reduce the resistivity and the transmittance of the SAW filters in order to increase the yield of the SAW filters.

However, the blackened piezoelectric wafers formed by the traditional blackening process are prone to have poor blackening uniformity, poor chromaticity and high transmittance and thus, have poor quality. Furthermore, the traditional blackening process is only suitable for small-sized piezoelectric wafers which have a size equal to or smaller than 4 inches. The small-sized piezoelectric wafers may have limited surface area and high cost for fabricating circuits thereon. If the traditional blackening process is performed on large-sized piezoelectric wafers having a size larger than 4 inches, a thermal gradient on a certain location thereof may be too large or too small. That is because the large-sized piezoelectric wafers require a larger thermal gradient, and such thermal gradient in a radial direction is hard to be expanded, thereby adversely affecting the blackening uniformity, chromaticity and transmittance of the blackened large-sized piezoelectric wafers thus formed.

Thus, there is a need to improve the blackening uniformity, chromaticity, and transmittance of the blackened piezoelectric wafers having a relatively large size.

SUMMARY

Therefore, an object of the disclosure is to provide a blackened wafer, wave filter device having the same, and method for manufacturing the same that can alleviate at least one of the drawbacks of the prior art.

According to a first aspect of the disclosure, a method for blackening at least one wafer includes: (a) performing a reduction treatment on the at least one wafer; and (b) illuminating the at least one wafer with an ultraviolet (UV) light. The at least one wafer after the illumination of the UV light has a blackening uniformity value (DE value) smaller than 0.6, and a chromatic value (L value) smaller than 54.

According to a second aspect of the disclosure, a blackened wafer is made from the aforementioned method. The blackened wafer has a transmittance larger than 0% and smaller than 5% at a light wavelength ranging from 300 nm to 900 nm. The blackening uniformity value (DE value) ranges from 0.3 to 0.6, and the chromatic value (L value) ranges from 48 to 54.

According to a third aspect of the disclosure, a wave filter device includes the aforementioned blackened wafer and a transducer unit disposed on the blackened wafer. The transducer unit includes a first transducer as an input device and a second transducer as an output device.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
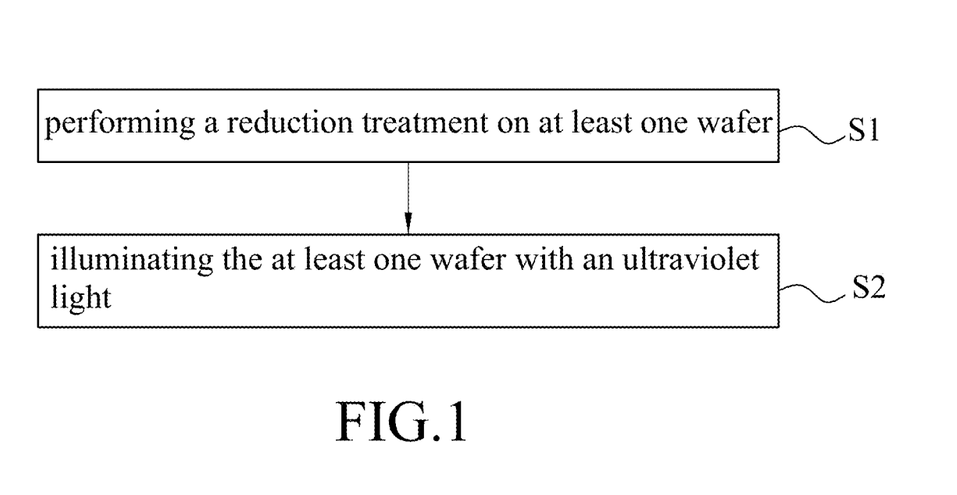
FIG. 1 is a flow chart illustrating an embodiment of a method for blackening at least one wafer according to the disclosure.

Referring to FIG. 1, an embodiment of a method for blackening at least one wafer is illustrated. In this embodiment, the method is adapted not only for relatively small-sized wafers (e.g., 4-inch wafers) but also for relatively large-sized wafers (e.g., 6-inch, 8-inch, 10-inch wafers, etc.). Larger surface area of the relatively large-sized wafers allows the utility of the blackened wafers to be increased and the cost for fabricating circuits on the blackened wafers to be reduced. The blackened wafer may be used as a substrate of a surface acoustic wave (SAW) filter. In one example, the blackened wafer is a piezoelectric wafer which may be made of lithium tantalate (LiTaO$_3$) or lithium niobate (LiNbO$_3$).

As shown in FIG. 1, the method for blackening at least one wafer includes the following steps S1 and S2. In the step S1, a reduction treatment is performed on the at least one wafer, and, in the step S2, the at least one wafer is illuminated with a UV light. In this embodiment, the reduction treatment (the step S1) is performed before the illumination of the UV light (the step S2). In one variation of the embodiment, referring to FIG. 2, the reduction treatment (the step S1) is performed after the illumination of the UV light (step S2). The at least one wafer after the illumination of the UV light has a blackening uniformity value (DE value) smaller than 0.6, and a chromatic value (L value) ranges from 46 to 54. In one example, the DE value ranges from 0.3 to 0.6 and the L value ranges from 48 to 54. In another example, the DE value ranges from 0.3 to 0.5. In yet another example, the L value ranges from 48 to 52.

Figure 3:
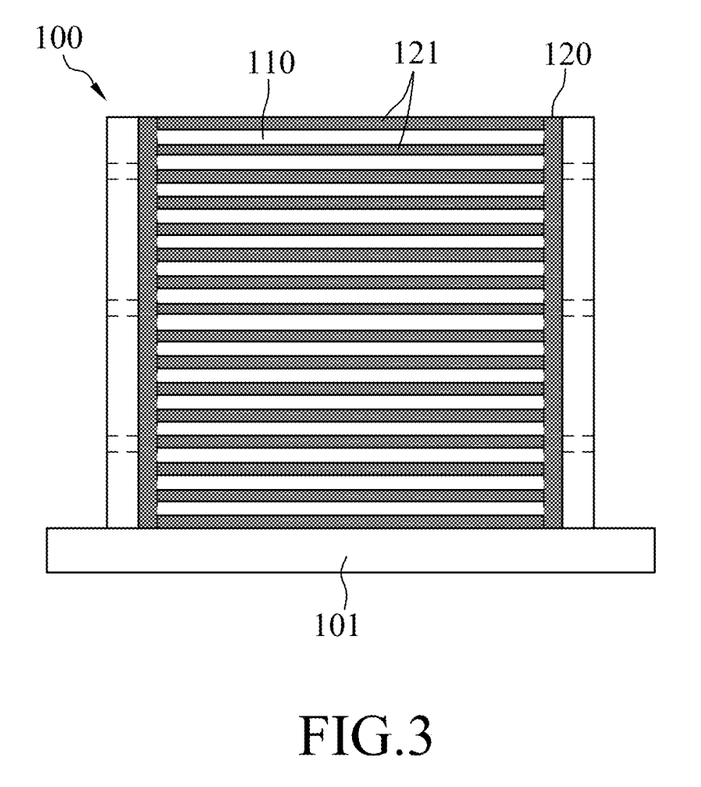
FIG. 3 is a schematic view illustrating a barrel fixture for a blackening furnace used in a reduction treatment in the embodiment of the method and the variation thereof.

In one embodiment, the at least one wafer includes a plurality of the wafers 110 (as shown in FIG. 3). In the step S1, the reduction treatment is performed on the wafers 110. In particular, a reduction medium mixture 120 including a plurality of reduction medium layers 121 is provided, the wafers 110 and the reduction medium layers 121 are alternately stacked (i.e., the wafers 110 are buried in the reduction medium mixture 120) in a barrel fixture 100 disposed on a heat-resistive base 101 (as shown in FIG. 3), and then the barrel fixture 100 is moved into a blackening furnace (not shown). At last, the wafers 110 and the reduction medium mixture 120 are subjected to the reduction treatment in a reductive environment in the presence of a reductive gas or an inert gas, at a reduction temperature lower than the Curie temperature of the material of the wafers 110 and ranging from 360° C. to 550° C., for a reduction time period ranging from 2 hr to 5 hr. In one example, the reduction treatment is conducted in the blackening furnace where the reductive gas or inert gas is introduced thereto.

In one example, the reduction medium mixture 120 is made of powder, a catalyst and a release agent. The powder includes one or more carbonate-based powder which has a grain size ranging from 10 μm to 1000 μm and has a weight ranging from 50% to 95% of a total weight of the reduction medium mixture 120. The catalyst is a carboxyl-containing organic compound, such as unsaturated polyester resin or acrylate, and has a weight ranging from 3% to 45% of the total weight of the reduction medium mixture 120. The release agent includes a non-metal oxide powder made from silicon dioxide, silicon carbide, silicon or combinations thereof, has a grain size ranging from 100 μm to 1000 μm, and has a weight ranging from 2% to 5% of the total weight of the reduction medium mixture 120.

In step S2, the wafers 110 is illuminated with the UV light for an illumination time period ranging from 0.1 hr to 2.5 hr, and the UV light has a wavelength ranging from 200 nm to 450 nm. In one example, the illumination time period is 1 hr. The wafers 110 are separated from a UV light source by a distance ranging from 30 cm to 100 cm. In an example where the wafers 110 are made of LiTaO$_3$, charge carriers are dominated by oxygen vacancies in the LiTaO$_3$ wafers 110. Due to the photoconductivity induced by UV light illumination, electrons trapped by the oxygen vacancies in the LiTaO$_3$ wafers 110 may be excited from the valence band to the conductive band and relax back to the valence band. Since LiTaO$_3$ wafers 110 have a gradient distribution of oxygen vacancies, the de-trapped oxygen vacancies diffuse and trap electrons again to achieve a balance, thereby causing the oxygen vacancy concentration to be homogeneously distributed in the LiTaO$_3$ wafers 110 and improving the blackening uniformity of the LiTaO$_3$ wafers 110.

In addition, by illuminating the wafers 110 with the UV light, more oxygen vacancies are induced in the wafers 110 which produce multiple defect states in the forbidden band gap, such that the optical absorption and the photorefractive sensitivity of the wafers 110 are changed, the photorefractive performance of the blackened wafers thus made may be enhanced, and the blackening uniformity is also improved.

Figure 2:
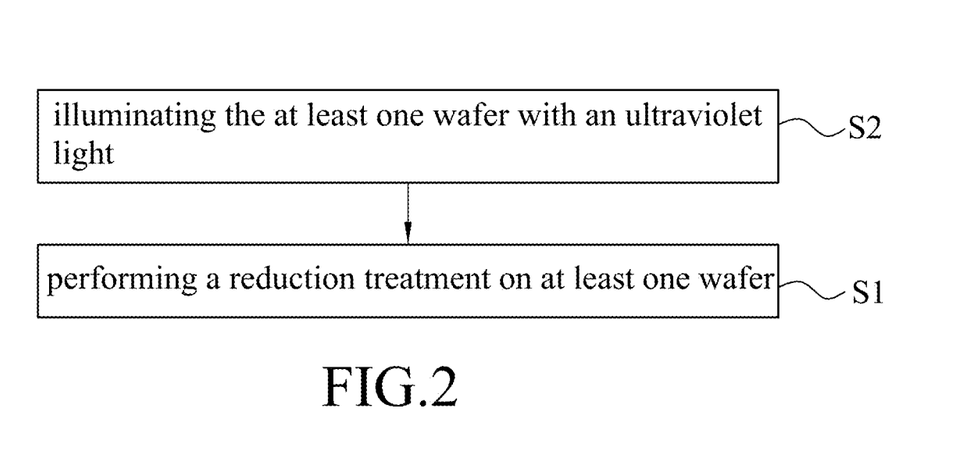
FIG. 2 is a flow chart illustrating a variation of the embodiment of the method in FIG. 1.

As mentioned above, each of the wafers 110 after the illumination of the UV light, i.e., the blackened wafers made from the method of FIGS. 1 and 2, has the DE value ranging from 0.3 to 0.6 and the L value ranging from 48 to 54. The L value is determined by selecting multiple testing spots on each of the blackened wafers and conducting color measurements on these testing spots using a wafer testing device 1 shown in FIG. 4 so as to obtain the L, a and b values of the respective blackened wafer. In one example, the wafer testing device 1 is a spectrophotometer. To be specific, the testing spots includes the center of the respective wafer 110 and four others located at the perimeter of the respective wafer 110 away from the edge thereof by a distance ranging from 2 mm to 4 mm, and the L, a and b values respectively represent the degree of blackness, the degree of redness and the degree of yellowness of the respective blackened wafer.

Figure 4:
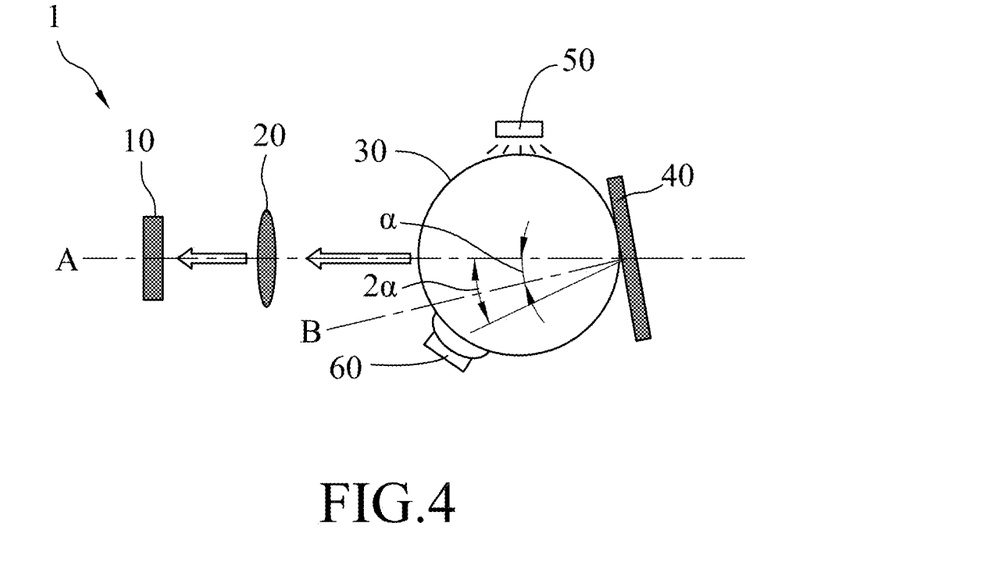
FIG. 4 is a schematic view illustrating a wafer testing device used for detecting an embodiment of a blackened wafer according to the disclosure.

Referring to FIG. 4, the wafer testing device 1 includes a detector 10, a lens 20 and an integrating sphere 30 arranged along a same axis (A). A blackened wafer 40 to be tested is held at a position where a center axis (B) of the blackened wafer 40 is at an angle (a) with respect to the axis (A), and the angle α ranges from 6° to 10°. The wafer testing device 1 further includes an auxiliary light source 50 and a light trap 60 which are disposed around the integrating sphere 30. To be specific, the light trap 60 is disposed at an angle (2a) with respect to the axis (A). With use of the wafer testing device 1, the testing spots on the blackened wafer 40 can be accurately measured so as to enhance quality of the blackened wafer 40.

The DE value, which represents the blackening uniformity value, is calculated from the following equation:

$$DE=\sqrt{\Delta L^2+\Delta a^2+\Delta b^2}$$

where ΔL indicates the difference between the maximum L value and the minimum L value of the testing spots in the color measurement, Δa indicates the difference between the maximum a value and the minimum a value of the testing spots in the color measurement, and Δb indicates the difference between the maximum b value and the minimum b value of the testing spots in the color measurement.

When a wafer is used for fabricating the wave filter device, photolithography process is required. In general, the shorter a wavelength of a light used in the photolithography process, the lower the transmittance to the wafer. In this embodiment, the blackened wafer 40 has a transmittance larger than 0% and smaller than 5% at a light wavelength ranging from 300 nm to 900 nm. Hence, when the blackened wafer 40 is subjected to the photolithography process during the fabrication of the wave filter device, there is no need to expose the blackened wafer 40 to the light having a short wavelength. Exposure of the blackened wafer 40 to the light having a longer wavelength also enables the blackened wafer 40 to have required low transmittance, thereby reducing the cost of photolithography.

Three experimental examples (i.e., E1, E2 and E3) and three comparative examples (i.e., CE1, CE2 and CE3) were conducted for illustrating the relationship among different factors (i.e., wafer size, reduction temperature, UV light illumination) during blackening process, and the DE values and L values of the wafers respectively prepared in the E1 to E3 and CE1 to CE3, on average, are shown in Table 1 below.

The E1 exemplifies manufacture of the blackened wafers in accordance with the blackening method illustrated in FIG. 1. In the E1, a plurality of 6-inch wafers are stacked with the reduction medium layers 121 of the reduction medium mixture 120 as mentioned above. Then, the wafers and the reduction medium mixture 120 are positioned in the blackening furnace, and are subjected to the reduction treatment. The temperature of the blackening furnace is gradually raised up to the reduction temperature of 450° C. Upon raising the reduction temperature, hydrogen gas as a reducing agent is introduced into the blackening furnace and allow oxygen gas to be exhausted from the blackening furnace. The temperature of the blackening furnace is maintained at the reduction temperature of 450° C. for 3 hr, and then, the blackening furnace is stopped from being heated and is naturally cooled to the room temperature. Thereafter, the wafers are taken out of the blackening furnace and are subjected to post-process including grinding, thinning and polishing.

The wafers are subsequently illuminated with the UV light having the wavelength ranging from 315 mm to 400 nm for an illumination time period of 1 hr. The wafers are separated from a source of the UV light by a distance of 50 cm. On average, the L value of the resulting blackened wafers measured by the spectrophotometer is 48.9 and the DE value calculated therefrom is 0.45.

The E2 exemplifies manufacture of the blackened wafers in accordance with the blackening method illustrated in FIG. 2. The E2 is carried out in a manner similar to that of E1 except that the reduction treatment and the post-process are performed after the UV light illumination in E2. On average, the L value of the resulting blackened wafers of E2 is 49.2 and the DE value calculated therefrom is 0.48.

The E3 is carried out in a manner similar to that of E1 except that the reduction temperature is 360° C. On average, the L value of the resulting blackened wafers of E3 is 51.9 and the DE value calculated therefrom is 0.51.

The CE1 is carried out in a manner similar to that of E1 except that 4-inch wafers are used and that illumination of the wafers with the UV light is dispensed. On average, the L value of the resulting blackened wafers of CE1 is 50.2 and the DE value calculated therefrom is 0.66.

The CE2 is carried out in a manner similar to that of CE1 except that 6-inch wafers are used. On average, the L value of the resulting blackened wafers of CE2 is 51.5 and the DE value calculated therefrom is 1.37.

The CE3 is carried out in a manner similar to that of E1 except that the reduction temperature is 360° C. and that illumination of the wafers with the UV light is dispensed. On average, the L value of the resulting blackened wafers of CE3 is 53.6 and the DE value calculated therefrom is 1.67.

TABLE 1

Experimental and Comparative Examples

| Items | Process | Wafer Size | Reduction T (° C.) | UV t (hr) | DE Value | L Value |
|---|---|---|---|---|---|---|
| E1 | reduction + UV | 6" | 450 | 1 | 0.45 | 48.9 |
| E2 | UV + reduction | 6" | 450 | 1 | 0.48 | 49.2 |
| E3 | reduction + UV | 6" | 360 | 1 | 0.51 | 51.9 |
| CE1 | reduction | 4" | 450 | — | 0.66 | 50.2 |
| CE2 | reduction | 6" | 450 | — | 1.37 | 51.5 |
| CE3 | reduction | 6" | 360 | 1 | 1.67 | 53.6 |

As shown in Table 1, comparing the L and DE values of the resulting blackened wafers of the CE1 with that of the CE2, the blackening effect of the blackening method exclusive of UV-light illumination on the 4-inch wafers is better than the 6-inch wafers. In other words, for the traditional blackening method, the blackening effect of the large-sized wafers is obviously worse than that of the small-sized wafers.

Comparing the L and DE values of the resulting blackened wafers of the E1 and E2 with that of the CE1 and CE2, the L and DE values of the resulting blackened wafers of the E1 are close to the L and DE values of the resulting wafers of the E2, respectively. The L and DE values of the resulting blackened wafers of the E1 and E2 are obviously smaller than those of the CE1 and CE2.

Furthermore, comparing the L and DE values of the resulting blackened wafers of the E1 and E2 with that of the CE2, with the blackening method inclusive of the UV-light illumination according to the disclosure, the DE value of the resulting blackened wafers of the E1 and E2 can be reduced at least 65%, preferably 67%, relative to that of the CE2.

It is obviously that the blackening method inclusive of UV-light illumination according to the disclosure can improve the blackening effect of the large-sized wafers, and that the blackening effect of the large-sized wafers will not be affected by changing the order of the reduction treatment and the UV-light illumination in the blackening method.

Besides, comparing the DE and L values of the resulting blackened wafers of the E3 with that of the CE3, it is apparent that the blackening method inclusive of the UV-light illumination according to the disclosure will improve the blackening effect on the large-sized wafers even if the large-sized wafers are subjected to the reduction treatment under a lower reduction temperature. Accordingly, the cooling time for the reduction treatment can be shortened, the productive efficiency can be increased and the manufacturing cost can be reduced.

Figure 5:
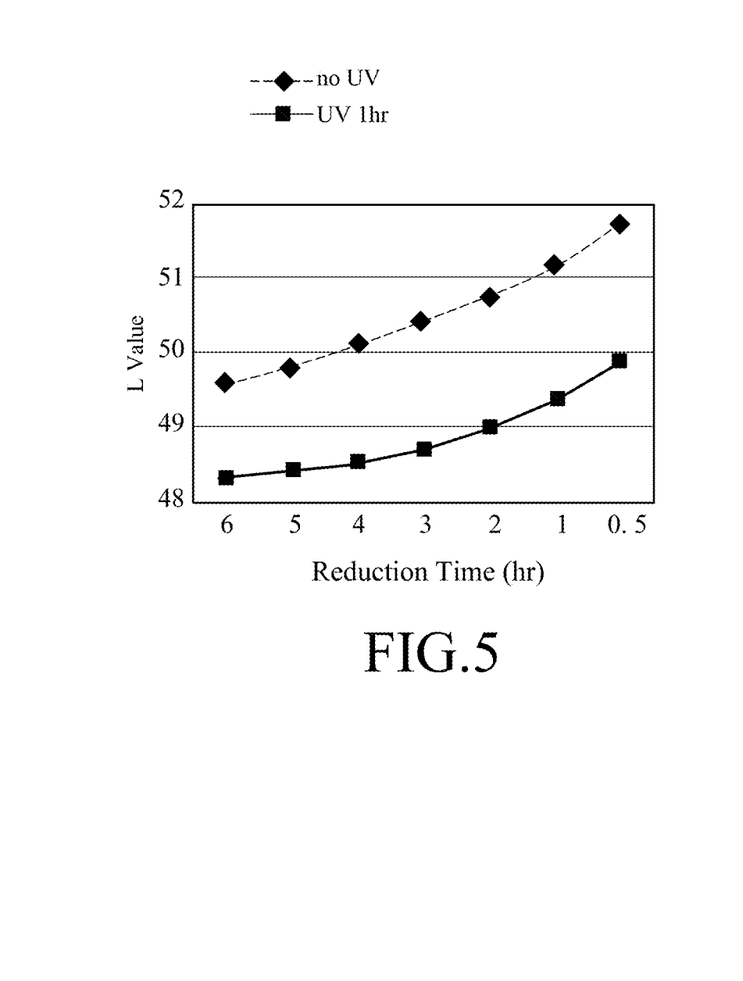
FIG. 5 is a graph showing blackening uniformity values (DE values) of a 6-inch blackened wafer made from the method of FIG. 1 and a comparative 6-inch wafer only subjected to reduction treatment at different reduction time periods.
Figure 6:
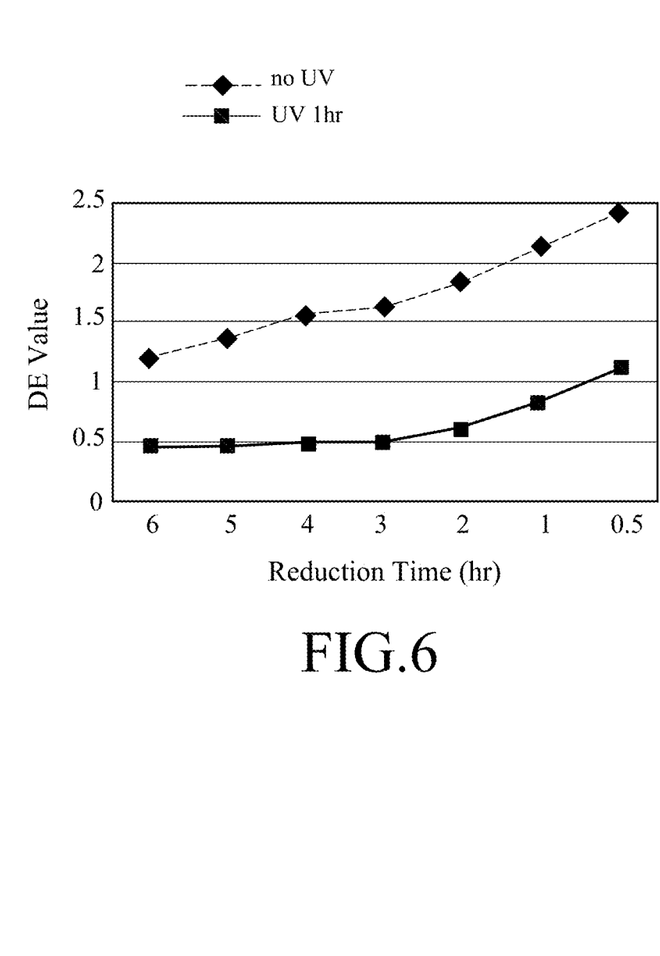
FIG. 6 is a graph showing chromatic values (L values) of the 6-inch blackened wafer made from the method of FIG. 1 and the comparative 6-inch wafer only subjected to reduction treatment at different reduction time periods.

Referring to FIG. 5, a graph shows a relationship between L values of the 6-inch blackened wafers obtained from the E1 and that of the 6-inch blackened wafers obtained from the CE2 at different reduction time periods (i.e., 6 hr, 5 hr, 4 hr, 3 hr, 2 hr, 1 hr and 0.5 hr). These L values are measured by spectrophotometer. Referring to FIG. 6, a graph shows a relationship between DE values of the 6-inch blackened wafers obtained from the E1 and that of the 6-inch blackened wafers obtained from the CE2 at different reduction time periods (i.e., 6 hr, 5 hr, 4 hr, 3 hr, 2 hr, 1 hr and 0.5 hr). As shown in FIGS. 5 and 6, both of the DE values and L values of the blackened wafers of the CE2 become larger as the reduction time period reduces. For the blackened wafers of the E1, the L values become larger as the reduction time period reduces, but the DE values are approximately the same when the reduction time period is longer than 3 hr, and are obviously changed when the reduction time period is shorter than 2 hr. That is, with the UV-light illumination, the reduction time period for the reduction treatment of the large-sized blackened wafers can be effectively shortened, such as 2 hours, with the enhanced blackening uniformity and the reduced manufacturing cost.

Figure 7:
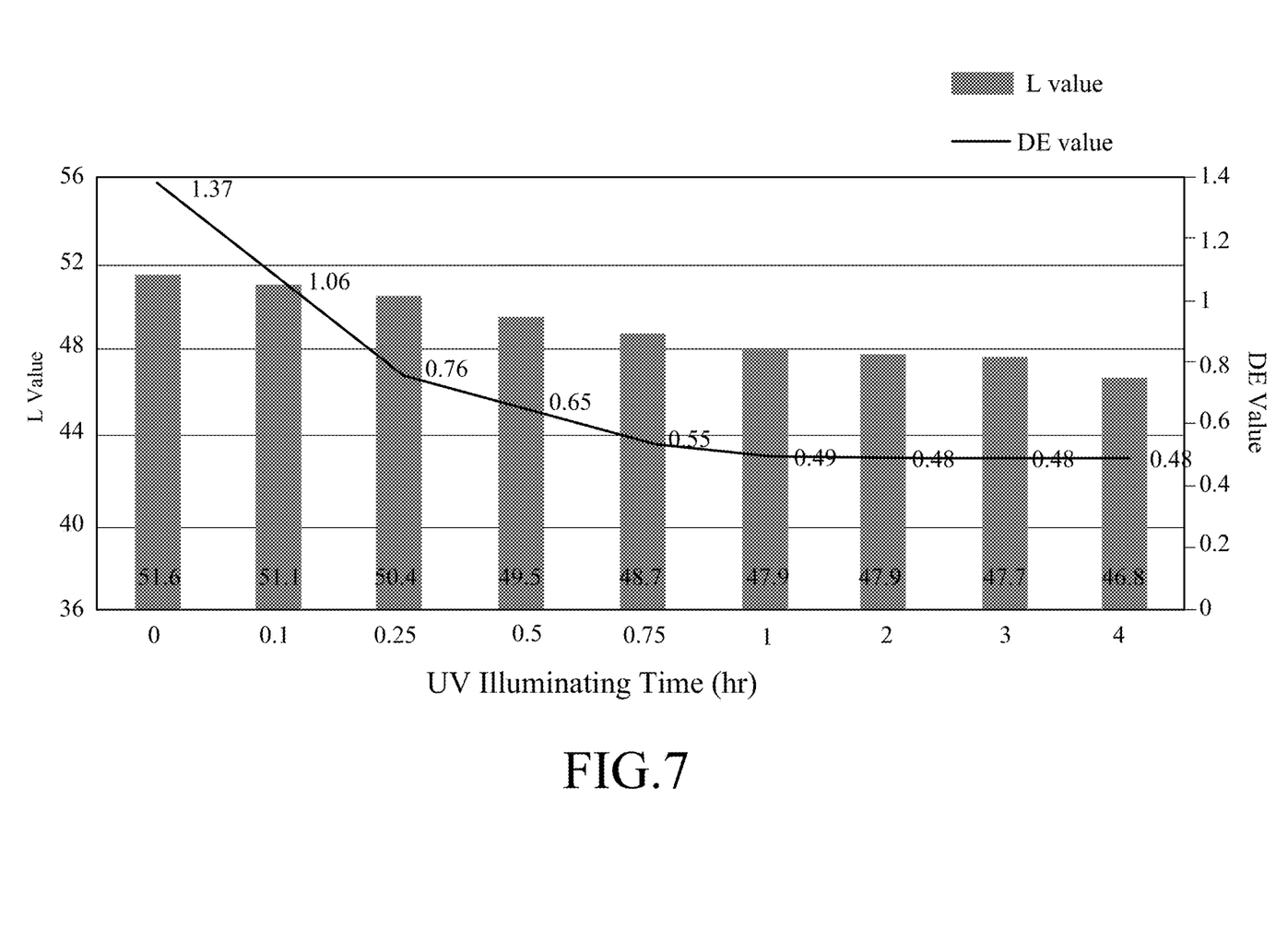
FIG. 7 is a graph showing a relationship between the DE values and the L values of the 6-inch blackened wafer made from the method of FIG. 1 at different UV illuminating time periods.

Referring to FIG. 7, a graph shows a relationship between the DE values and the L values of the 6-inch blackened wafers obtained from the E1 at different UV illuminating time periods (i.e., 0.1 hr, 0.25 hr, 0.5 hr, 0.75 hr, 1 hr, 2 hr, 3 hr and 4 hr). The L values shown in FIG. 7 are also measured by the spectrophotometer. As shown in FIG. 7, in the UV illuminating time periods ranging from 0.1 hr to 1 hr, the DE values and L values of the 6-inch blackened wafers both become smaller as the UV-light illumination time periods increases. In the circumstance that the UV illumination time period is longer than 1 hr, the DE values and L values of the 6-inch blackened wafers are approximately the same, which means that the enhancing effect of UV light illumination on the blackening uniformity of the wafers are limited when the wafers are illuminated with the UV light for more than 1 hr. In other words, the preferred illumination time period of the UV light for the wafers is 1 hr.

Figure 8:
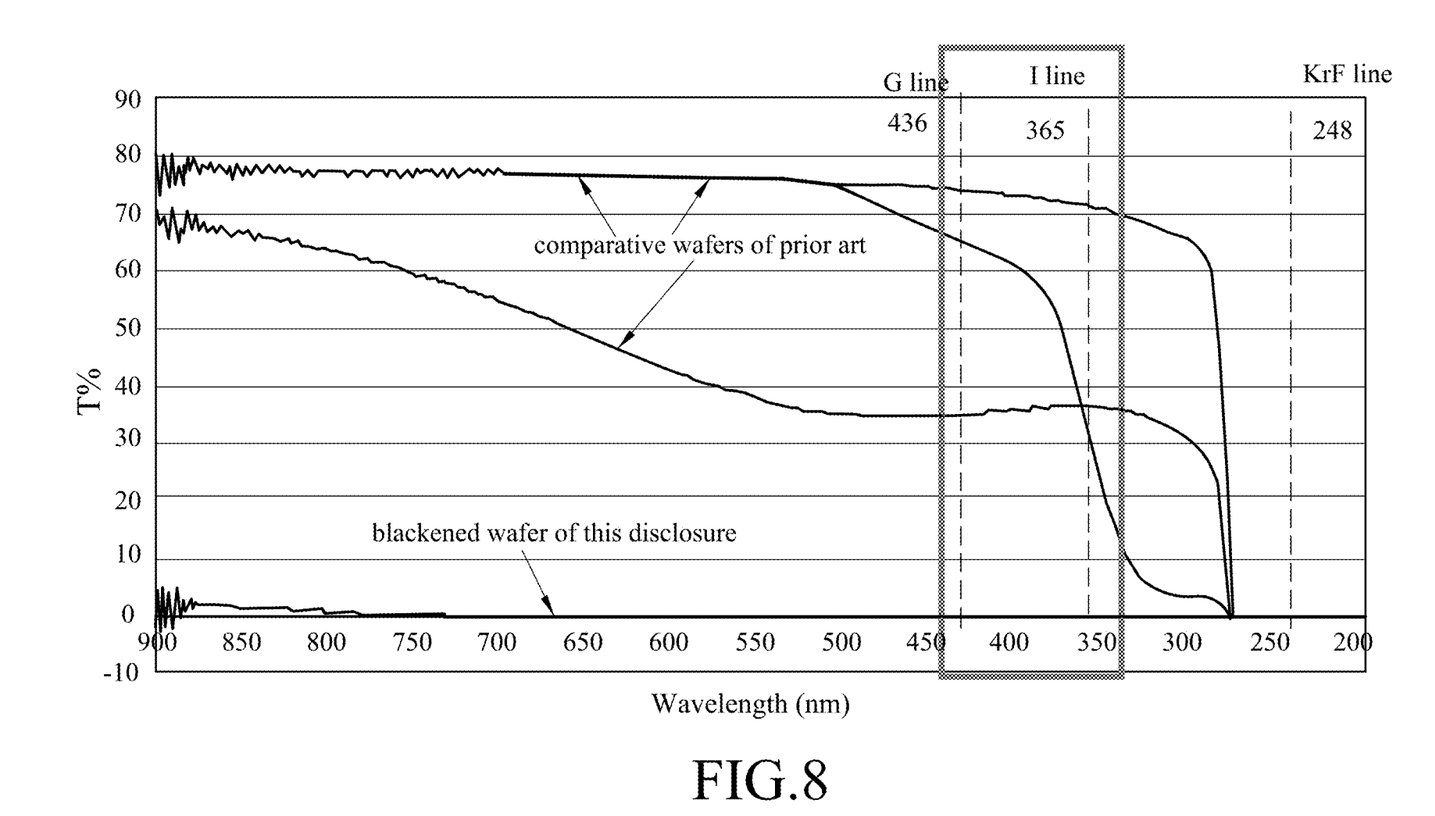
FIG. 8 is a graph showing transmittance of the blackened wafer made from the method of FIG. 1 and comparative wafers made from prior art at different light wavelengths.

Referring to FIG. 8, a graph shows transmittance of large-sized blackened wafers, i.e. 6-inch, 8-inch and 10-inch wafers, on average, made from the blackening method illustrated in FIG. 1 and traditional methods involving only reduction treatment at different light wavelengths. As shown in FIG. 8, the large-sized blackened wafers obtained from the blackening method of FIG. 1 has a transmittance larger than 0% and smaller than 5% at a light wavelength ranging from 300 nm to 900 nm. In particular, the transmittance of the large-sized blackened wafers obtained from the blackening method of FIG. 1 is relatively low at light wavelengths of 436 nm (G line) and 365 nm (I line), these wavelengths being commonly used in the exposure procedure of the lithography. The precision of the linewidth of the exposed pattern may thus be enhanced. Moreover, the large-sized blackened wafers obtained from the traditional methods has a transmittance higher than that of the large-sized blackened wafer obtained from the blackening method of FIG. 1. As a result, the large-sized blackened wafer made from the blackening method according to the disclosure has a better blackening uniformity.

Figure 9:
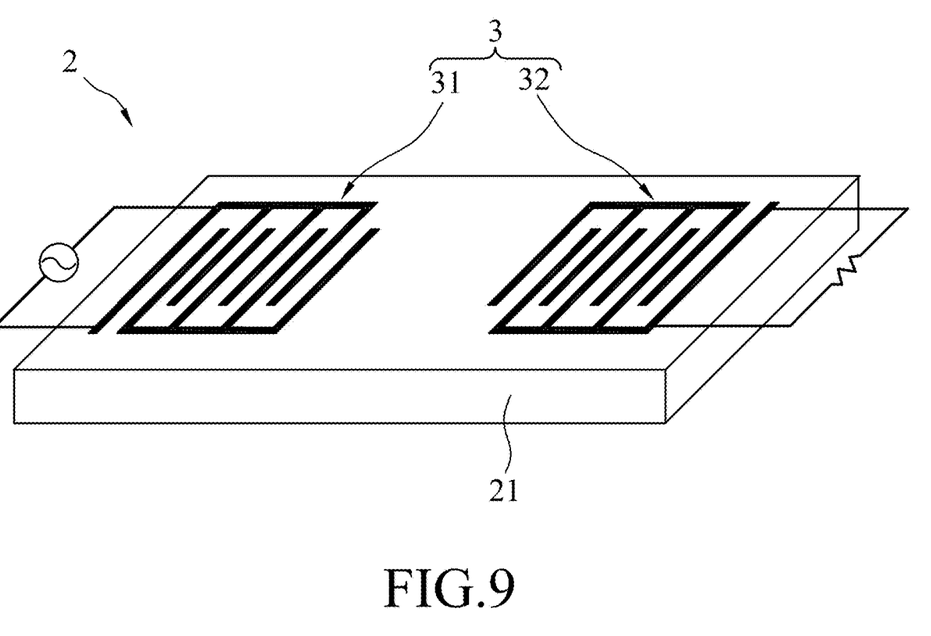
FIG. 9 is a schematic view illustrating an embodiment of a wave filter device according to the disclosure.

Referring to FIG. 9, an embodiment of a wave filter device 2 is shown. In this embodiment, the wave filter device 2 is a surface acoustic wave (SAW) filter. The wave filter device 2 includes a blackened wafer 21 made by the blackening method illustrated in FIG. 1 or 2, and a transducer unit 3 including a first transducer 31 as an input device and a second transducer 32 as an output device. In this embodiment, the first transducer and the second transducer 32 are interdigital transducers.

To sum up, the large-sized blackened wafers made by reduction treatment and UV-light illumination has a better blackening uniformity and a lower transmittance compared to the large-sized blackened wafers made by the traditional method. Moreover, the reduction time period for the reduction treatment of the large-sized blackened wafers may be shortened and the reduction treatment may be performed under a lower reduction temperature, which may increase the productive efficiency and reduce the manufacturing cost. On the other hand, since the blacked wafers according to the disclosure has a lower transmittance at a light wavelength ranging from 300 nm to 900 nm (longer wavelength), there is no need to expose the blackened wafer to the light having a short wavelength, thereby reducing the cost of photolithography.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for blackening at least one wafer, comprising the steps of:
   (a) performing a reduction treatment on the at least one wafer; and
   (b) illuminating the at least one wafer with an ultraviolet (UV) light,
   wherein the at least one wafer after the illumination of the UV light has a blackening uniformity value (DE value) smaller than 0.6, and a chromatic value (L value) ranging from 46 to 54.

2. The method of claim 1, wherein the DE value ranges from 0.3 to 0.6 and the L value ranges from 48 to 54.

3. The method of claim 1, wherein the reduction treatment is performed before the illumination of the UV light.

4. The method of claim 1, wherein the reduction treatment is performed after the illumination of the UV light.

5. The method of claim 1, wherein the at least one wafer has a size of 6 inch, 8 inch or 10 inch.

6. The method of claim 1, wherein in step (b), the at least one wafer is illuminated with the UV light for an illumination time period ranging from 0.1 hr to 2.5 hr, and the UV light has a wavelength ranging from 200 nm to 450 nm.

7. The method of claim 6, wherein the at least one wafer is illuminated with the UV light for 1 hr.

8. The method of claim 1, wherein the at least one wafer includes a plurality of the wafers, and
   wherein in step (a), the reduction treatment is performed on the wafers and includes the following steps:
     providing a reduction medium mixture including a plurality of reduction medium layers;
     alternately stacking the wafers and the reduction medium layers; and
     reductively treating the wafers with the reduction medium mixture under a reduction temperature ranging from 360° C. to 550° C. for a reduction time period ranging from 2 hr to 5 hr.

9. A blackened wafer made from the method of claim 1, wherein said blackened wafer has a transmittance larger than 0% and smaller than 5% at a light wavelength ranging from 300 nm to 900 nm, the DE value ranging from 0.3 to 0.6, and the L value ranging from 48 to 54.

10. The blackened wafer of claim 9, wherein the DE value of said blackened wafer ranges from 0.3 to 0.5.

11. The blackened wafer of claim 9, wherein the L value of said blackened wafer ranges from 48 to 52.

12. The blackened wafer of claim 9, wherein said blackened wafer has a size of 6 inch, 8 inch or 10 inch.

13. The blackened wafer of claim 12, wherein said blackened wafer is a piezoelectric wafer which is made of lithium tantalate ($LiTaO_3$) or lithium niobate ($LiNbO_3$).

14. A wave filter device, comprising:
said blackened wafer of claim 9; and
a transducer unit disposed on said blackened wafer, wherein said transducer unit includes a first transducer as an input device and a second transducer as an output device.

15. The wave filter device of claim 14, wherein the wave filter device is a surface acoustic wave filter.

16. The wave filter device of claim 14, wherein said first transducer and said second transducer are interdigital transducers.

* * * * *